United States Patent [19]

Ho et al.

[11] Patent Number: 5,601,438
[45] Date of Patent: Feb. 11, 1997

[54] INDEPENDENT SOCKET FOR USE WITH STACKED MEMORY CARD CONNECTOR ASSEMBLY

[75] Inventors: Yu-Ming Ho, Taipei Hsieh, Taiwan; Robert G. McHugh, Evergreen, Colo.

[73] Assignee: Hon Hai Precision Ind. Co., Ltd., Taipei, Taiwan

[21] Appl. No.: 354,369

[22] Filed: Dec. 12, 1994

[51] Int. Cl.[6] ..................................................... H01R 23/70
[52] U.S. Cl. ........................................... 439/64; 439/541.5
[58] Field of Search ...................... 439/153, 155, 439/157, 159, 160, 540, 62, 64, 79, 541.5

[56] References Cited

U.S. PATENT DOCUMENTS

| 5,137,462 | 8/1992 | Casey et al. | 439/160 |
|---|---|---|---|
| 5,286,207 | 2/1994 | McHugh | 439/159 |
| 5,305,180 | 4/1994 | Mitchell et al. | 439/159 |
| 5,320,540 | 6/1994 | Lwee | 439/159 |
| 5,324,204 | 6/1994 | Lwee | 439/159 |
| 5,330,363 | 7/1994 | Gardner et al. | 439/160 |
| 5,364,275 | 11/1994 | Ota et al. | 439/157 |
| 5,374,198 | 12/1994 | Nagata | 439/153 |

*Primary Examiner*—P. Austin Bradley
*Assistant Examiner*—Jill Demello

[57] ABSTRACT

A memory card connector assembly (10) includes a pair of memory card connectors (12, 14) stacked together wherein an independent auxiliary alignment socket (40), which is aligned with but spaced from the connector housings (20), and directly mounted on the board (100), incorporates the contact tails (25) of the upper connector (12) for efficiently establishing electrical and mechanical connection between the upper connector (12) and the board (100) on which such memory card connector assembly (100) is seated.

5 Claims, 6 Drawing Sheets

5,601,438

INDEPENDENT SOCKET FOR USE WITH STACKED MEMORY CARD CONNECTOR ASSEMBLY

BACKGROUND OF THE INVENTION

1. Field of The Invention

The invention relates to interface means for use with stacked memory card connector assembly, particularly to an elongated socket having contact tails therein for SMT (Surface Mount Technology) on a PC board on which such socket and an adjacent stacked memory card connector assembly are seated wherein such socket is spaced from such memory card connector assembly, and mechanically and electrically interconnects the contacts of the upper connector of such memory card connector assembly.

2. The Prior Art

Memory card connectors are popularly used in the recent years because miniaturization and flexibility of the computer are the trends in the computer industry. It is common for the computer manufacturer to arrange two memory cards in a vertically close relationship in usage for saving the space in the computer, and therefore, obviously such two memory card connectors which are adapted to receive the corresponding two closely spaced memory cards therein, respectively, are designedly stacked together vertically in compliance with the configuration of such two closely spaced memory cards.

U.S. Pat. Nos. 5,149,276, 5,176,523, 5,286,207, 5,290,174 and 5,318,452 disclose two memory cards stacked together in a vertical direction for reception of two corresponding memory cards therein; Similarly, U.S. Pat. Nos. 4,810,203, 5,324,204 and 5,334,046 also disclose two-unit memory card connector assembly enclosed in a unitary housing for reception of two corresponding memory cards therein. It should be understood that because the dimension of the contact gets tinier and tinier, it is uneasy to directly precisely bend the tails of the contacts of the upper connector in place with regard to the PC board on which such connector assembly is mounted. In other words, the vertical distance between the upper connector and the PC board increases uncertainty of the true position of the tails of the contacts of the upper connector. Without any auxiliary device to align the tails of the upper connector, the defect ratio may be increased due to misalignment of the contact tails of the upper connector; otherwise, the strict precision of the manufacturing process may be required that substantially increases the cost. To avoid the aforementioned disadvantages, most stacked type connector assemblies include auxiliary devices for aligning the tails of the upper connectors regardless of whether they are the memory card type connector or the other types. In some Input/Output connectors, some means which electrically and mechanically connect the contact tails of the upper connector to the corresponding traces of the PC board are disclosed in U.S. Pat. Nos. 4,818,239, 4,878,856, 5,044,984, 5,080,609, 5,085,590, 5,267,876 and 5,336,109.

As shown in the aforementioned U.S. Pat. No. 5,286,207 (having the same assignee with the invention) and U.S. Pat. No. 5,334,046 which belong to memory card connectors, or U.S. Pat. Nos. 4,818,239, 4,878,856, 5,044,984, 5,080,609, 5,085,590 and 5,267,876 which belong to Input/Output connectors, most such auxiliary alignment devices are required to be operatively attached, integrally or separately, to the connector housing for fastening said auxiliary alignment device in place. Accordingly, generally the housing of the lower connector needs to include an extended rear portion to incorporate such auxiliary alignment device. In other words, it is required to make another special mold for manufacturing such extended connector housing instead of a common set of mold which is adapted to manufacture the general standard connector.

Accordingly, an object of the invention is to provide an independent auxiliary alignment socket for use with a memory card connector assembly including a pair of single memory card connectors stacked together in a vertical direction. Such alignment socket substantially has no relation to the connector housing so that it is unnecessary to make another specific mold for the lower connector to incorporate such socket. Thus, the cost of manufacturing can be saved.

SUMMARY OF THE INVENTION

According to an aspect of the invention, a memory card connector assembly includes a pair of memory card connectors stacked together wherein an independent auxiliary alignment socket, which is aligned with but spaced from the connector housings, and directly mounted on the board, incorporates the contact tails of the upper connector for efficiently establishing electrical and mechanical connection between the upper connector and the board on which such memory card connector assembly is seated.

DETAILED DESCRIPTION OF THE PREFERRED EMBODIMENT

References will now be made in detail to the preferred embodiments of the invention. While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
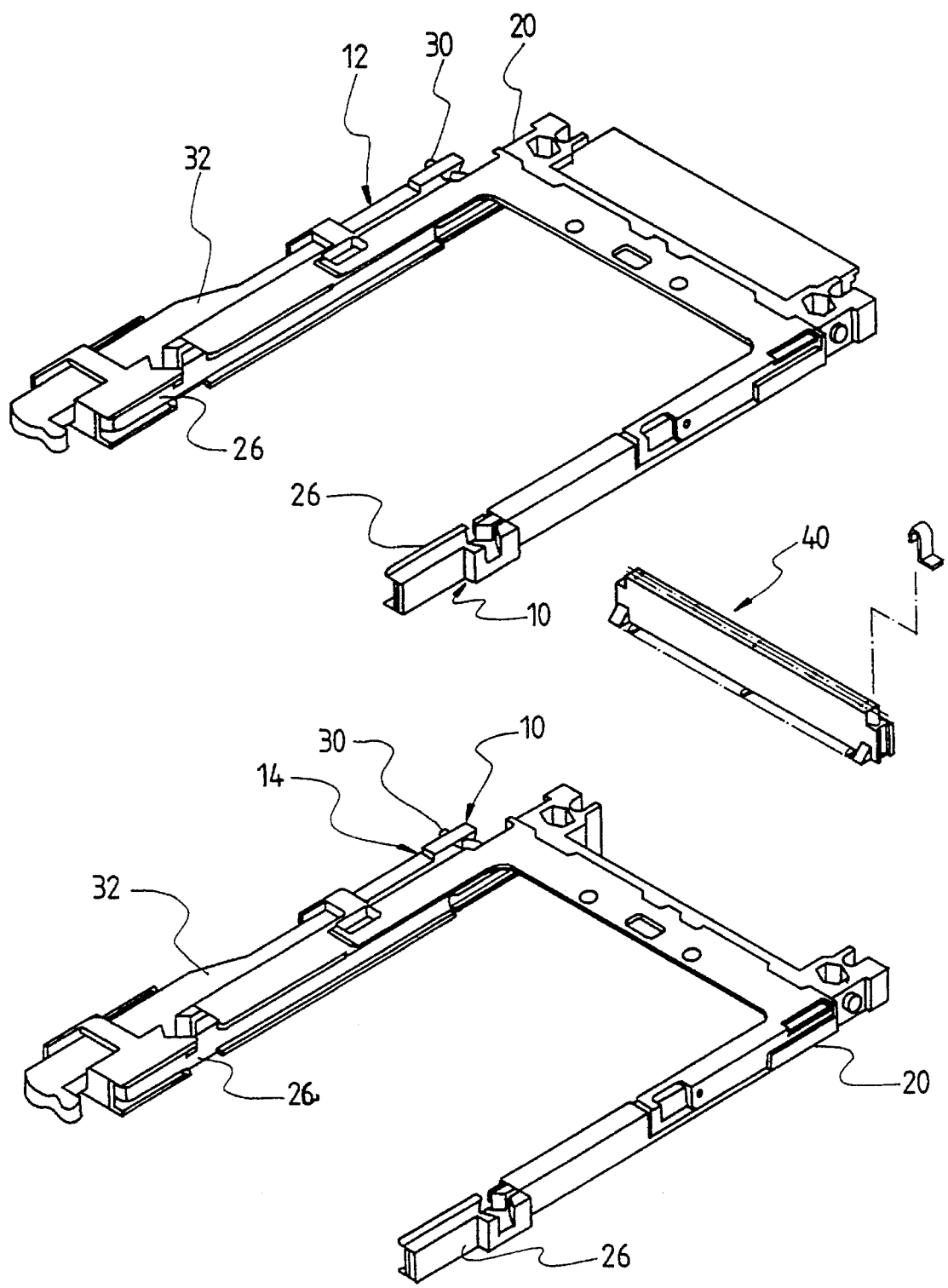
FIG. 1 is an exploded rear perspective view of a presently preferred embodiment of a memory card connector assembly, without contacts therein, accompanying an auxiliary socket aside, according to the invention.

It will be noted here that for a better understanding, most of like components are designated by like reference numerals throughout the various figures in each embodiment. Attention is now directed to FIG. 1 wherein a memory card connector assembly 10 includes an upper connector 12 and a lower connector 14 stacked with each other in a vertical direction. Each connector 12, 14 commonly comprises an insulative housing 20 including a plurality of passageways 22 (FIG. 3) extending therethrough in a front-to-end direction for reception of a corresponding number of contacts 24 therein.

Each connector 12, 14 further includes a pair of guiding arms 26 positioned on two sides thereof for guiding entrance of a memory card (not shown), and a set of ejection devices including a sliding plate (not shown) actuated by a pivotal lever 30 which is driven by a pushing bar 32. The basic internal detailed structure of the connector 12, 14 can be referred to co-pending applications of Ser. No. 08/299,482 filed Aug. 31, 1994 and Ser. No. 08/318,428 filed Oct. 5, 1994.

This embodiment of the invention focuses on an independent auxiliary alignment socket 40 for use with such memory card connector assembly 10 for electrically and mechanically engagement with the contact tails 25 of the upper connector 12 whereby the signals of the upper connector can be transmitted to the PC board 100 (FIG. 3) on which such memory card connector assembly 10 is mounted through the contacts of the socket 40.

Figure 2:
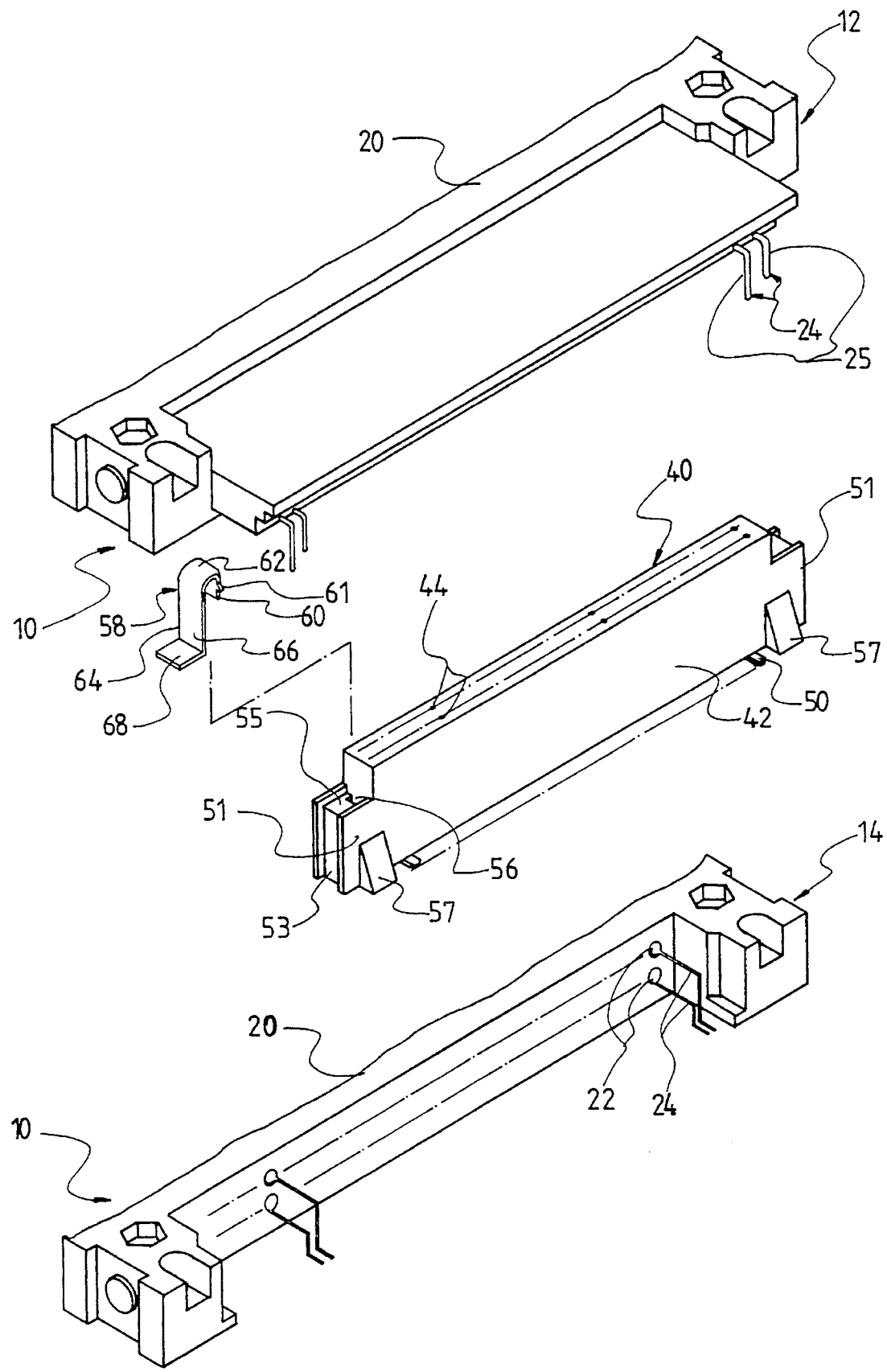
FIG. 2 is a fragmentary front perspective view of the memory card connector assembly with contacts therein and the associated socket of FIG. 1.
Figure 3:
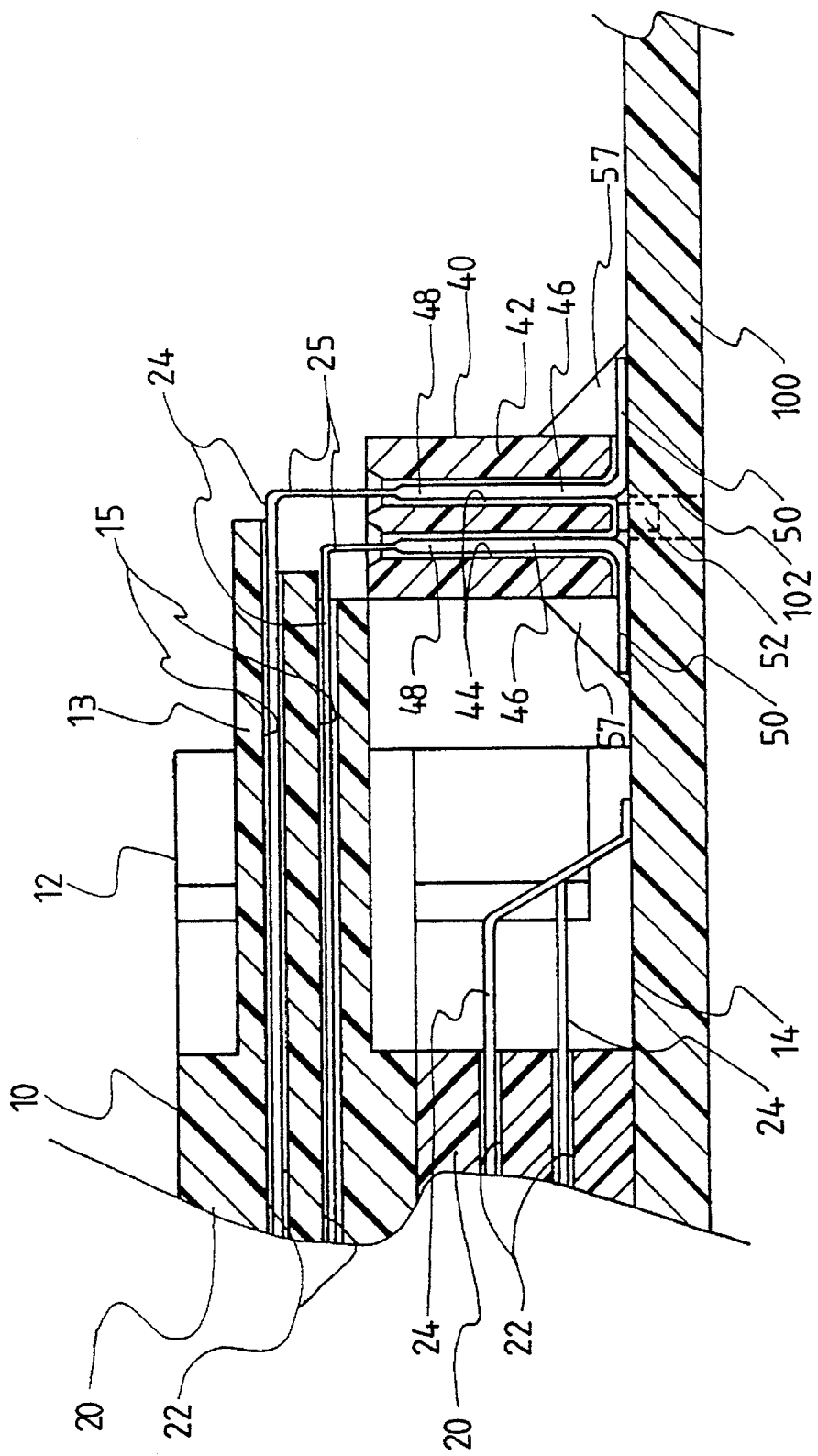
FIG. 3 is a fragmentary cross-sectional view of the memory card connector assembly and the socket spaced therefrom of FIG. 2 to show the structural relationship therebetween.

In detail, referring to FIGS. 2 and 3, the independent socket 40 includes an insulative elongated housing 42 whose length is generally equal to that of the housing 20 of the connector 12, 14. A plurality of passageways 44 vertically extend through the housing 42 of the socket 40, and a corresponding number of contacts 46 are retainably positioned within the passageways 44, respectively. Each contact 46 has a contact section 48 for engagement with the tail 25 of the corresponding contact 24 therein, and a tail section 50 adapted to be surface-mount-soldered on the PC board 100.

The socket 40 further comprises a pair of mounting blocks 51 at two opposite ends of the housing 42. Each mounting block 51 has a pair of triangular piers 57 at two sides thereof for increasing the standing area for stabilization of the socket 40 on the PC board 100. Also, the tails 50 of the contacts 46 are structurally positioned within the region defined between the lengthwise opposite two piers 57 of the housing 42. A pair of guiding posts 52 (FIG. 3) having axial ribs thereon, extend downwardly from the underside of the blocks 51 for interferential engagement within a pair of corresponding holes 102 in the PC board 100. Thus, the socket 40 can be loaded onto the PC board 100 and properly retained in place. Respectively extending parallel to the end walls 53 of the blocks 51 are a pair of cavities 56 for retaining a pair of corresponding mounting tabs 58 therein (only one shown). Each mounting tab 58 includes a vertical retention section 60 having barbs 61 on two sides and adapted to be retainably received within the corresponding cavity 56, a horizontal section 62 adapted to be seated on the top surface 55 of the block 51, and a L-shaped aligning section 64 in which a vertical section 66 abuts against the end wall 53 of the block 51 and a horizontal mounting section 68 is adapted to be soldered on the solder pads printed on the PC board 100 for retaining the socket 40 in place on the PC board 100. It can be understood that such the horizontal mounting section 68 of the mounting tab 58 extends outwardly in the lengthwise direction of the socket housing 42, and is solderably fastened to the PC board 100, thus reinforcing the fixation of the socket 40 to the PC board 100.

The socket 40 can be applied to the memory card connector assembly 10 under the situation that such socket 40 is independently disposed spaced from and in front of the lower connector 14 in a predetermined distance wherein the socket 40 is generally aligned with the connector 14 in the front-to-end direction and is substantially parallel to the housing 20 of the connector 14. Consequently, the tails 25 of the contact 24 of the upper connector 12 can be received within the contact section 48 of the corresponding contacts 46 in the socket 40, so that the signals of the upper connector 12 can be transmitted to the PC board 100 through the contacts 46 of the socket 40.

It can be seen that in this embodiment, surface mounting is applied to the connection between the PC board 100 and the components thereon such that the contacts 24 of the lower connector 14 and the contacts 46 of the socket 40 have horizontal tails for attachment thereto. Moreover in this embodiment, in comparison with the lower connector 14, the upper connector 12 optionally specifically comprises a horizontal extending section 13 integrally forwardly projecting from the housing 20 wherein a plurality of through holes 15 which is in alignment with the corresponding passageways 22 of the housing 20 of the upper connector 12, extend in the front-to-end direction for aligning the tails 25 of the contact 24 of the upper connector 12 adapted to be engaged with the contact 46 of the socket 40.

It can be appreciated that different from the prior art auxiliary socket devices as disclosed in U.S. Pat. Nos. 5,286,207 and 5,334,046 which are directly or integrally attached to the housing of the lower connectors and thus such prior art connector housing can not help having a huge pocket portion at the front end for receiving such associated socket, the socket 40 used in the invention is totally separated from the lower connector 14, thus preventing a front redundant pocket portion or projection portion of the connector housing. In other words, the simple single type memory card connector which is originally used in a single form on the board, can be also used in a stacked double form in the invention. This prevents another set of mold for manufacturing such stacked memory card connector(s), and saves the material and simplifies the production process for not forming the forwardly projecting pocket used in the aforementioned two prior art connector assemblies.

Figure 4:
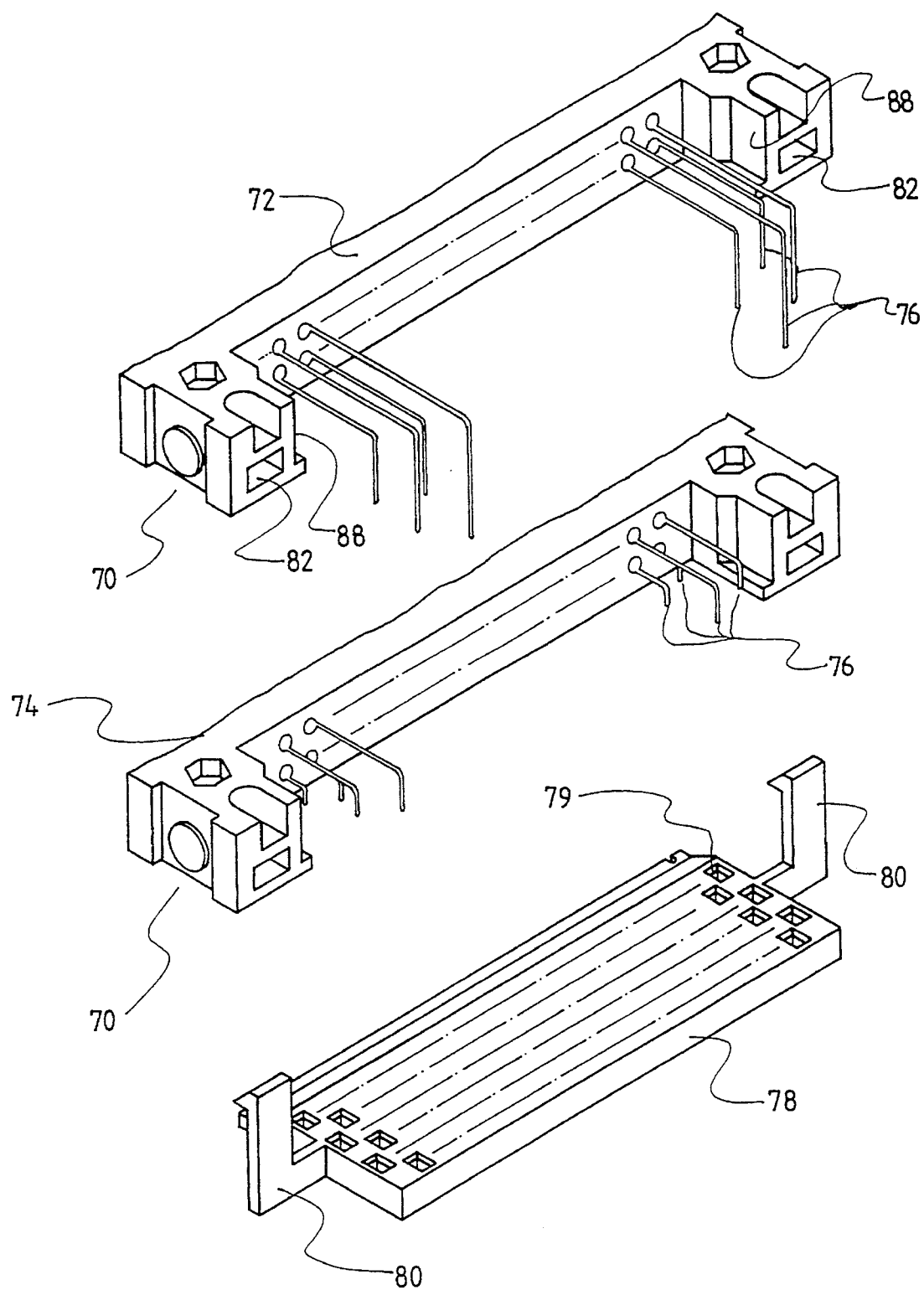
FIG. 4 is a fragmentary front perspective view of a second embodiment of the memory card connector assembly and an associated spacer.
Figure 5:
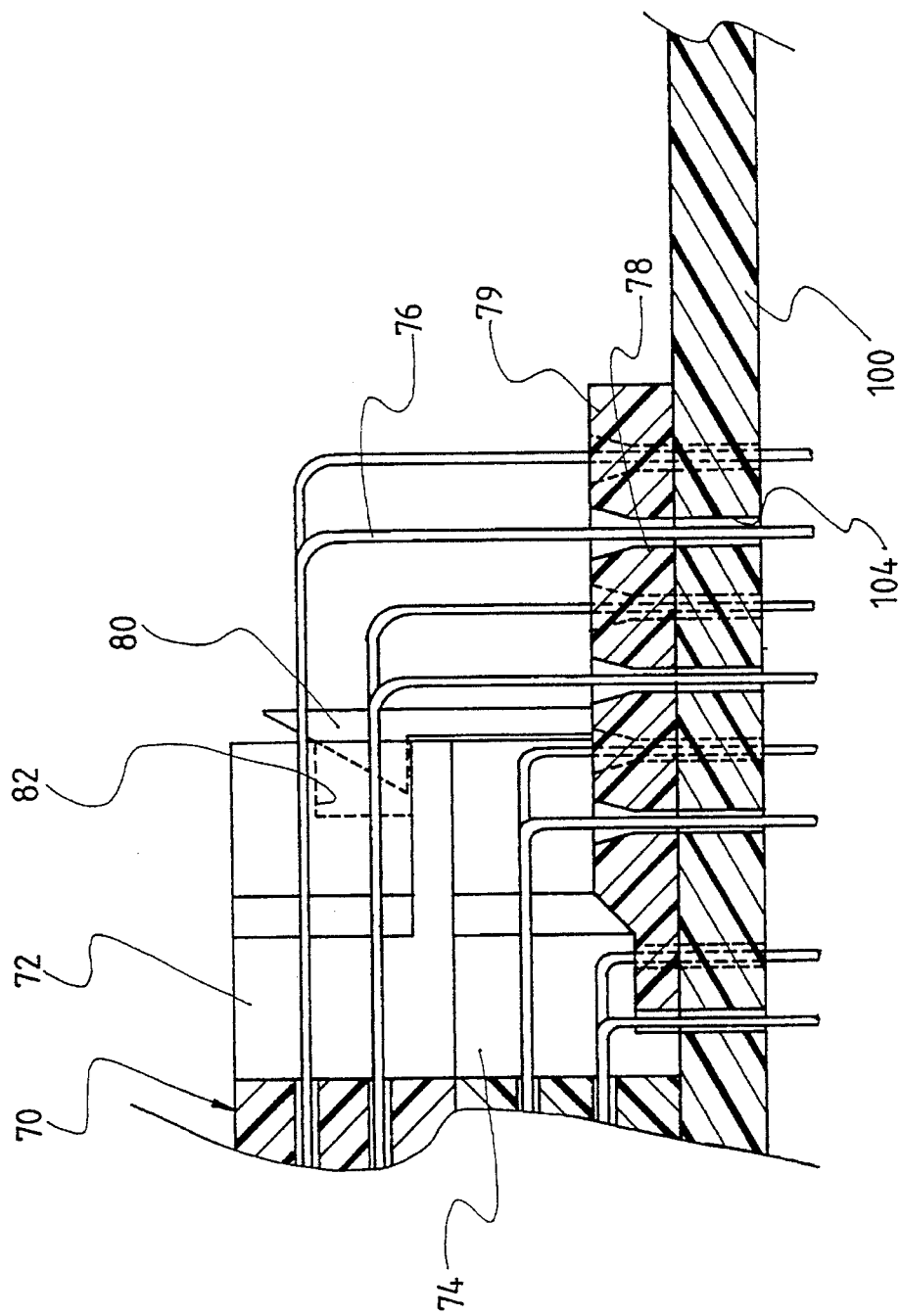
FIG. 5 is a fragmentary cross-sectional view of the memory card connector assembly and the associated spacer of FIG. 4.
Figure 6:
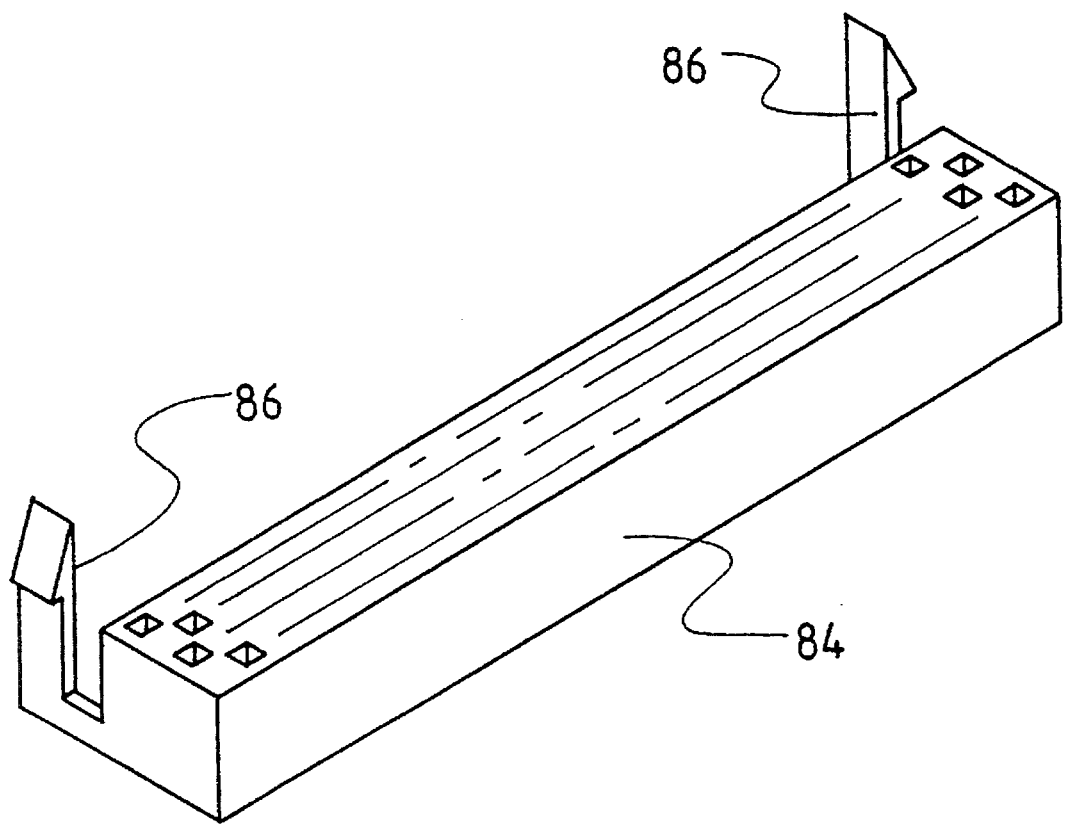
FIG. 6 is a fragmentary front perspective view of a third embodiment of the memory card connector assembly and an associated spacer.

FIGS. 4 and 5 show another embodiment of the stacked memory card connector assembly. The memory card connector assembly 70 has most common parts as those of the memory card connector assembly 10 in FIG. 1, except that the contacts 76 of the connectors 72, 74 extend through the holes 104 in the PC board 100 for soldering attachment. A spacer plate 78 have a plurality of holes 79 vertically extending therethrough for both aligning the tails of the upper connector contacts 76 and the lower connector contacts 76 to the corresponding holes 104 in the PC board 100. Such spacer plate 78 has a pair of vertical hooks 80 at its two opposite ends for retainable engagement with the recesses 82 in the front end wall portion of the upper connector 72. Referring to FIGS. 4 and 6, in the third embodiment, such spacer plate 84 only incorporates the contact tails of the upper connector for alignment, and the hooks 86 of the spacer 84 are latched within the side indents 88. It can be contemplated that in the second and third embodiments, even though such spacer (78, 84) is attached to the upper connector housing (72), such connector housing still keeps its original compact dimension as the regular single type connector housing. In conclusion, in the present invention, it is allowed to stack two regular single type connectors together and cooperate with the auxiliary alignment socket or spacer for surface mounting or through-hole soldering on the board. In contrast, most prior art connectors need to use the different type or the prolonging connector housings, as shown in U.S. Pat. Nos. 5,286,207 and 5,334,046, other than the original single one to implement the stacking structure of two memory card connectors. Therefore, the invention is more flexible in manufacturing and saves the cost.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

What is claimed is:

1. A connector assembly for surface mounting on a PC board, comprising:

a lower connector and an upper connector aligned and stacked with each other in a vertical direction, each connector including an insulative housing having a plurality of passageways extending therethrough in a front-to-end direction for receiving a corresponding number of first contacts therein;

an independent auxiliary alignment socket disposed substantially spaced from and in front of said lower connector, whereby said socket is generally aligned with the lower connector in the front-to-end direction and is parallel to the housing thereof;

said socket including an elongated insulative housing having a plurality of passageways extending therethrough in the vertical direction for receiving therein a corresponding number of second contacts wherein each second contact of the socket has a contact section adapted to be electrically and mechanically engaged with tails of the first contacts of the upper connector, respectively, and a tail section adapted to be surface-mounted on the PC board; and a pair of mounting blocks positioned at two opposite ends of the housing of the socket, each mounting block at least including mounting means for independently retaining said socket onto the PC board with no structural fixation relationship to the housings of the upper connector and the lower connector; wherein said connector is a memory card connector whereby a pair of guiding arms extend at two opposite ends of the housing in the front-to-end direction; and wherein each mounting block has a triangular pier on each side for stabilization of the socket on the PC board, and the tails of the second contacts of the socket are confined within an area defined by two lengthwise opposite piers.

2. The connector assembly as described in claim 1, wherein said mounting means is a mounting tab, one end of which is retainably embedded in a cavity in the mounting block, and the other end of which is attachably soldered on a corresponding pad for fixation of the socket on the board.

3. The connector assembly as described in claim 1, wherein said mounting means is a post extending downwardly from underside of the mounting block for interferential engagement with a corresponding hole in the board.

4. A connector assembly including an upper connector and a lower connector stacked with each other in a vertical direction, each connector having a substantially identical insulative elongated housing having a plurality of passageways extending therethrough for reception of a corresponding number of contacts therein, both of the upper and lower connectors being adapted to be connected to a PC board, on which said connector assembly is seated, via tails of contacts of the upper connector and tails of contacts of the lower connector extending through corresponding holes in the PC board, and a spacer plate having a plurality of holes extending therein in the vertical direction for at least aligning tails of the contacts of the upper connector with regard to the corresponding holes in the PC board, wherein said spacer further includes a hook at each of two ends for latchable engagement within a pair of corresponding recesses in a front portion of the housing of the upper connector.

5. The connector assembly as described in claim 4, wherein said spacer plate further aligns the contacts of the lower connector of the connector assembly with regard to the corresponding holes in the PC board.

* * * * *